(12) United States Patent
Jeon

(10) Patent No.: US 11,498,422 B2
(45) Date of Patent: Nov. 15, 2022

(54) SMART GARNISH FOR AUTOMOBILE

(71) Applicants: SEOYON E-HWA CO., LTD., Seoul (KR); SEOYON AMERICA CORPORATION, Auburn Hills, MI (US)

(72) Inventor: Chong Hwan Jeon, Seoul (KR)

(*) Notice: Subject to any disclaimer, the term of this patent is extended or adjusted under 35 U.S.C. 154(b) by 301 days.

(21) Appl. No.: 16/885,971

(22) Filed: May 28, 2020

(65) Prior Publication Data

US 2021/0086617 A1 Mar. 25, 2021

(30) Foreign Application Priority Data

Sep. 19, 2019 (KR) .......................... 10-2019-0115152

(51) Int. Cl.
- *B60K 37/06* (2006.01)
- *B60K 35/00* (2006.01)
- *H03K 17/96* (2006.01)

(52) U.S. Cl.
CPC .............. *B60K 37/06* (2013.01); *B60K 35/00* (2013.01); *H03K 17/962* (2013.01); *B60K 2370/1446* (2019.05); *B60K 2370/332* (2019.05); *B60K 2370/693* (2019.05); *H03K 2217/960755* (2013.01); *H03K 2217/960785* (2013.01)

(58) Field of Classification Search
None
See application file for complete search history.

(56) References Cited

U.S. PATENT DOCUMENTS

| 10,592,057 | B1* | 3/2020 | Tan ......................... G06F 3/044 |
| 2004/0213008 | A1* | 10/2004 | Bayersdorfer ......... B60K 35/00 362/545 |
| 2011/0148671 | A1* | 6/2011 | Wong .................... G06F 3/0216 341/27 |
| 2016/0132112 | A1* | 5/2016 | Vander Sluis ............ G06F 1/16 345/173 |
| 2016/0132113 | A1* | 5/2016 | Hotchkiss .............. B60K 35/00 345/173 |
| 2019/0278473 | A1* | 9/2019 | Fornasier ............ G06F 3/04817 |

FOREIGN PATENT DOCUMENTS

| KR | 20170126569 | 11/2017 |
| KR | 101985374 | 6/2019 |
| KR | 102007172 | 8/2019 |

* cited by examiner

*Primary Examiner* — Christopher R Lamb
(74) *Attorney, Agent, or Firm* — Harvest IP Law, LLP

(57) ABSTRACT

Provided is a smart garnish installed on an automobile interior material (a door trim, an instrument panel, a console, or the like), and to a smart garnish for an automobile which is driven when a capacitance change is sensed by a pressed deformation of an upper case through a capacitive touch sensor pad formed of a ground (GND) and capacitive touch sensors corresponding to symbols and capacitive force sensors distributed corresponding to the ground and thus the touch and force of the desired symbol are sensed without noise.

6 Claims, 10 Drawing Sheets

SMART GARNISH FOR AUTOMOBILE

BACKGROUND

1. Technical Field

The present invention relates to a smart garnish installed on an automobile interior material (a door trim, an instrument panel, a console, or the like), and more particularly, to a smart garnish for an automobile which is driven when a capacitance change is sensed by pressed deformation of an upper case through a capacitive touch sensor pad formed of a ground (GND) and capacitive touch sensors corresponding to symbols and capacitive force sensors distributed corresponding to the ground and thus the touch and force of the desired symbol are sensed without a noise.

2. Description of Related Art

As a conventional smart garnish for an automobile, one has been proposed as disclosed in Patent Document 1 (Korean Registered Patent No. 10-1985374) which is filed and registered by the applicant.

The smart garnish for an automobile in Patent Document 1 includes an IMD (in mold decoration) film in which a pattern or color is designed and printed in a surface of a base film and symbols and shielding are printed in a back surface, a shielding member including a touch sensor film and a shielding part insert-injection-molded from the touch sensor film, a permeable transparent base material insertion-molded between the IMD film and the shielding member, and an LED (light emitting diode) module assembled so that back surface LEDs are disposed on a lower surface of the shielding member and side surface LEDs are disposed on a side surface of the permeable transparent base material, wherein through-holes are formed in a portion of the shielding member corresponding to the symbols, and the back surface LEDs are disposed on the through-holes.

Accordingly, a process is reduced and an LED quantity is minimized.

However, the conventional touch sensor film can malfunction even when a driver touches, approaches, or passes an unwanted symbol in the vehicle.

Meanwhile, in Patent Document 2 (Korean Registered Patent No. 10-2007172), a switch device for an automobile in which touch sensors and mechanical force sensors are installed is disclosed.

That is, the mechanical force sensor is a case in which a pressing part protruding from a switch knob is operated by pressing a protrusion of the force sensor, and in this case, since the mechanical force sensor can malfunction when a driver leans his/her elbow or back on the switch knob and the switch knob is arbitrarily pressed, and a pressing protrusion to be pressed and the like are necessary, it is difficult to installed the mechanical force sensor for each symbol, and the configuration is a very complicated.

Further, the mechanical force sensor is sensed by pressurization of the pressing part, and since a pressurization amount is as small as 0.1 to 0.2 mm, when cumulative tolerances such as an injection tolerance, a size tolerance, and the like occur, air is pressed as much as the tolerance, and thus the mechanical force sensor does not operate.

In addition, since the pressing part is worn due to friction by the pressing of the mechanical force sensors, the pressurization is poor and thus the operation is not performed or becomes unstable.

In addition, in the touch sensors in Patent Document 2, since symbols and the mechanical force sensors separately sense an operation of a haptic actuator, the touch sensors can be operated even when an unwanted symbol is touched.

On the other hand, when both capacitive touch sensing and force sensing are satisfactory, a case in which symbols are operated is disclosed in a touch display device in Patent Document 3 (Korean Laid-Open Patent No. 10-2017-0126569).

That is, according to a type 2 in FIG. 4 in Patent Document 3, when a touch occurs due to a pointer which is a conductor and corresponds to a force touch which occurs due to a force which exceeds a predetermined level, a touch circuit can simultaneously sense a touch position and a touch force of the touch on the basis of signals received from each first electrode E1.

That is, when the touch occurs due to a pointer of which a contact part is a conductor and corresponds to a force touch which occurs due to a pressing force exceeding a predetermined level, since both a size change of a first capacitance $C1$ with the pointer for each first electrode $E1$ and a size change of a second capacitance $C2$ between the first electrode $E1$ and a second electrode $E2$ occur, both a touch position and a touch force for one touch can be sensed.

However, the first electrode $E1$ has a very thin thickness in which the touch and the force can correspond one-to-one.

That is, since sensing can be performed by pressing only a position of the first electrode to be touched, the force touch is widely used in a touch screen panel.

The sensing by the one-to-one correspondence has the following problems when applied to a garnish which is an injection-molded product.

Since the garnish injection-molded product has some thickness, when a desired symbol is pressed, not only the desired symbol is slightly pressed but a periphery is also pressed.

Further, in the garnish, since an upper surface is curved for aesthetic design, and thus thicknesses of upper and lower surfaces are not uniform, a portion to be pressed when the garnish is pressed is wide.

For example, when a center is pressed, an entire periphery is also pressed, and when the outside is pressed, only the periphery of the outside is also pressed and thus a gap is changed.

Accordingly, since a deformed portion which is pressed is wide, sensing by one-to-one matching has a lot of noise and thus a risk of malfunction is very high.

That is, since the number of symbols is very large, when the touch sensors and the force sensors are correspondingly disposed to the number of symbols, the pressed portion recognizes all the surrounding force sensors, and thus the noise increases as much.

Prior-Art Documents (Patent Document 1) Patent Document 1 (Korean Registered Patent No. 10-1985374)
(Patent Document 2) Patent Document 2 (Korean Registered Patent No. 10-2007172)
(Patent Document 3) Patent Document 3 (Korean Laid-Open Patent No. 10-2017-0126569)

SUMMARY

1. Technical Problem

A technical objective of the present invention is to provide a smart garnish for an automobile reliably operable by a capacitive force sensor distributed under a ground while accommodating stability and sensitivity.

2. Solution to Problem

A smart garnish for an automobile includes: a case; an upper case, in which a film having symbols printed therein is insert-injection-molded, being coupled to the case in front of the case; a PCB (printed circuit board) mounted in the case, wherein LEDs (light emitting diodes) mounted on the PCB illuminate the symbols; a capacitive touch sensor pad laminated on a rear surface of the upper case; and a capacitive force sensor pad laminated on a front surface of the case, wherein a gap is formed between the capacitive touch sensor pad and the capacitive force sensor pad, wherein the capacitive touch sensor pad includes capacitive touch sensors disposed corresponding to the symbols and a ground (GND) disposed spaced apart from the capacitive touch sensors, and wherein the capacitive force sensor pad includes capacitive force sensors distributed corresponding to the ground (GND).

In the smart garnish for an automobile of the present invention, a surface and the rear surface of the upper case may be formed of a three-dimensional (3D) curved surface and a flat surface, the film may be formed on the surface of the upper case, and the capacitive touch sensor pad may be installed on the flat surface of the upper case.

In the smart garnish for an automobile of the present invention, the case may include a case body in which the PCB is mounted, a cover configured to cover a back surface of the case body, and a case holder disposed on a front surface of the case body, wherein the upper case is assembled on the case holder, and a haptic actuator configured to vibrate the case holder relative to the case body may be mounted in the case.

The smart garnish for an automobile of the present invention may further include a restoring spring configured to elastically restore the case holder relative to the case body.

In the smart garnish for an automobile of the present invention, the restoring spring may be a plate spring, wherein an end of the plate spring is coupled to the case body and another end of the plate spring is coupled to the case holder, and the plate spring may include a front horizontal plate spring installed at the case body, a back horizontal plate spring installed at the case holder, and a vertical plate spring configured to connect the front and back horizontal plate springs.

The smart garnish for an automobile of the present invention may further include a diffusion sheet disposed between the capacitive force sensor pad and the case holder.

In the smart garnish for an automobile of the present invention, through-holes through which a light from the LEDs passes may be formed on a front surface of the case holder, and light guide tubes configured to connect the LEDs and the through-holes may be formed in the case holder.

3. Advantageous Effects

According to the present invention, there are following effects.

According to a specific product called a garnish which is an injection-molded product, a capacitive touch sensor pad (ground and capacitive touch sensors) and a capacitive force sensor pad (capacitive force sensors) are disposed to accommodate stability and sensitivity and definitely prevent a touch malfunction.

Particularly, since the capacitive force sensors are distributed corresponding to a ground (GND), an accurate operation without the noise of capacitive force sensing is provided even when an upper case has a 3D curved surface (design aspect) and various thicknesses while having a large thickness.

When a desired symbol accurately undergoes a capacitive touch and force sensing, a haptic motion provides operation feedback again through a tactile sensation or the like to improve emotional quality.

A plate spring for restoration is added to quickly restore a case holder and an upper case to original positions when the case holder and the upper case laterally vibrate relative to a case body.

Due to installation of a diffusion sheet and light guide tubes, light leakage of LEDs (light emitting diodes) is definitely prevented to provide optimization of LED quantity through uniformity of illuminance.

DESCRIPTION OF SYMBOLS

| | |
|---|---|
| 1: smart garnish for automobile | |
| 10: upper case | 12: film |
| 20: case | 20a: case body |
| 20b: cover | 20c: case holder |
| 25: light guide tube | 30: PCB |
| 31: LED | 40: capacitive touch sensor pad |
| 41: capacitive touch sensor | 50: capacitive force sensor pad |
| 51: capacitive force sensor | 60: haptic actuator |
| 70: restoring spring (plate spring) | 80: diffusion sheet |

DETAILED DESCRIPTION OF EMBODIMENTS

Hereinafter, exemplary embodiments of the present invention will be described with reference to the accompanying drawings.

Figure 1:
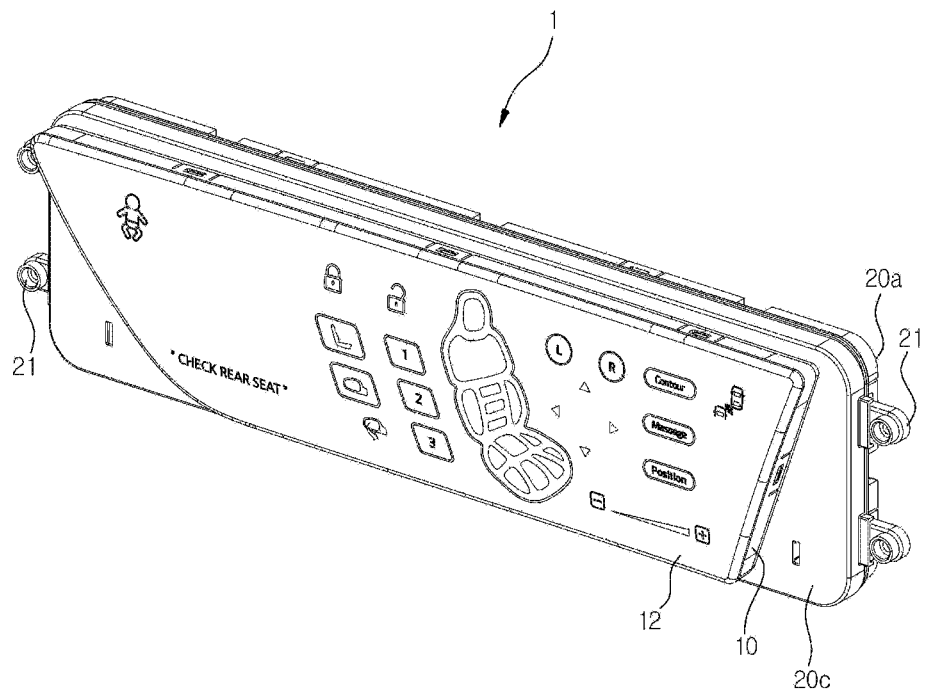
FIGS. 1 and 2 are front and back perspective views illustrating a smart garnish for an automobile according to an exemplary embodiment of the present invention, and are perspective views in which indirect lighting is turned on in the smart garnish and thus symbols are shown.
Figure 2:
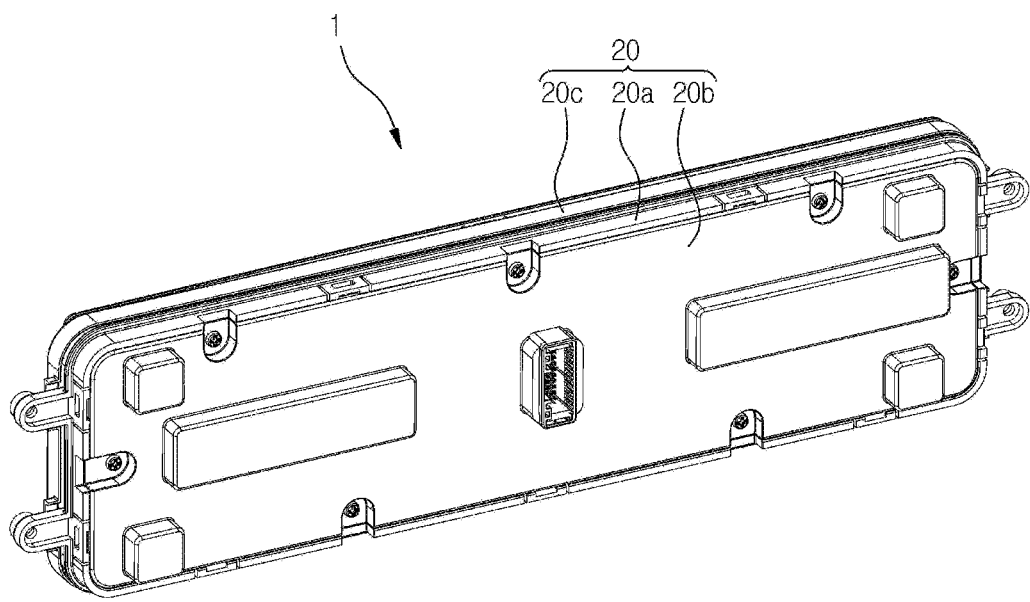
Figure 3:
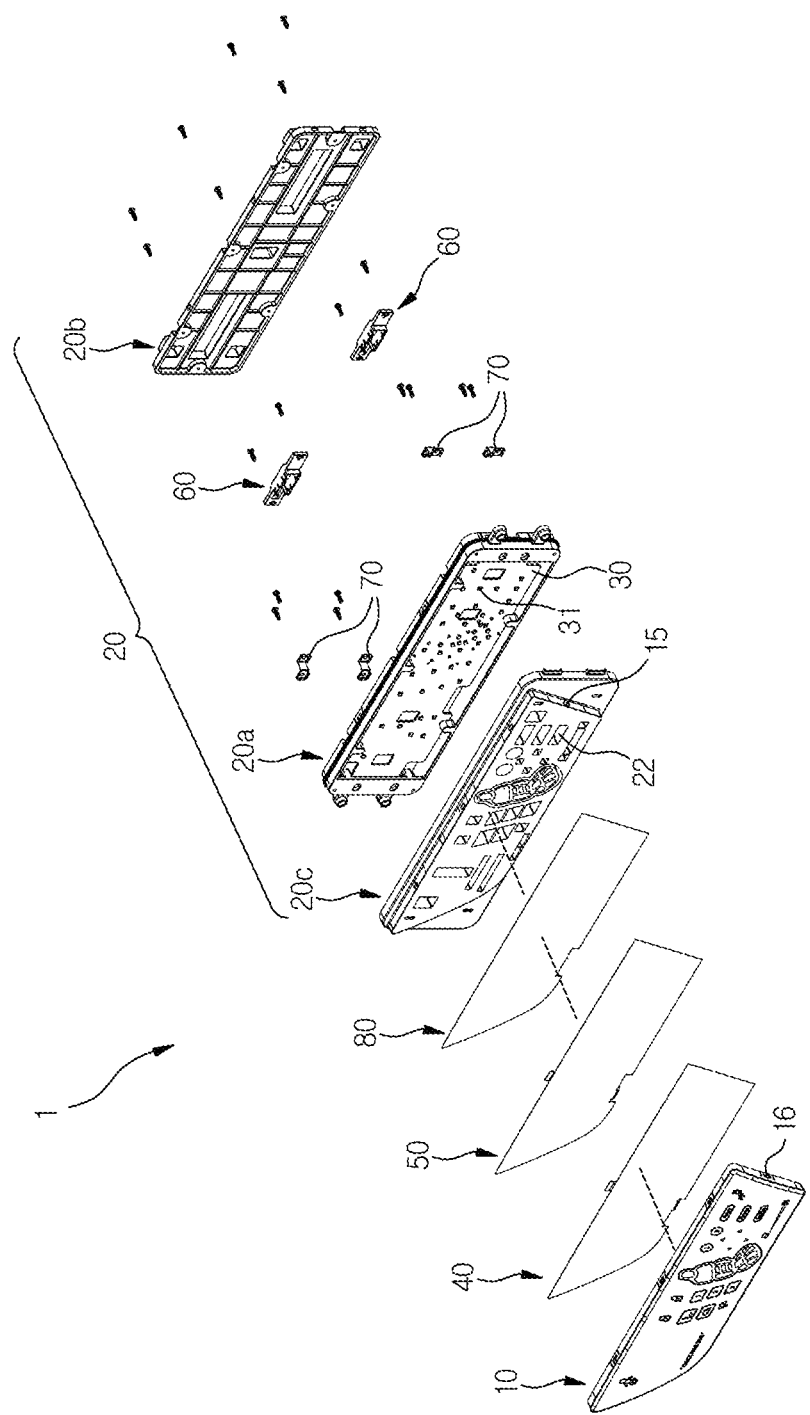
FIGS. 3 and 4 are exploded perspective views of FIGS. 1 and 2.
Figure 4:
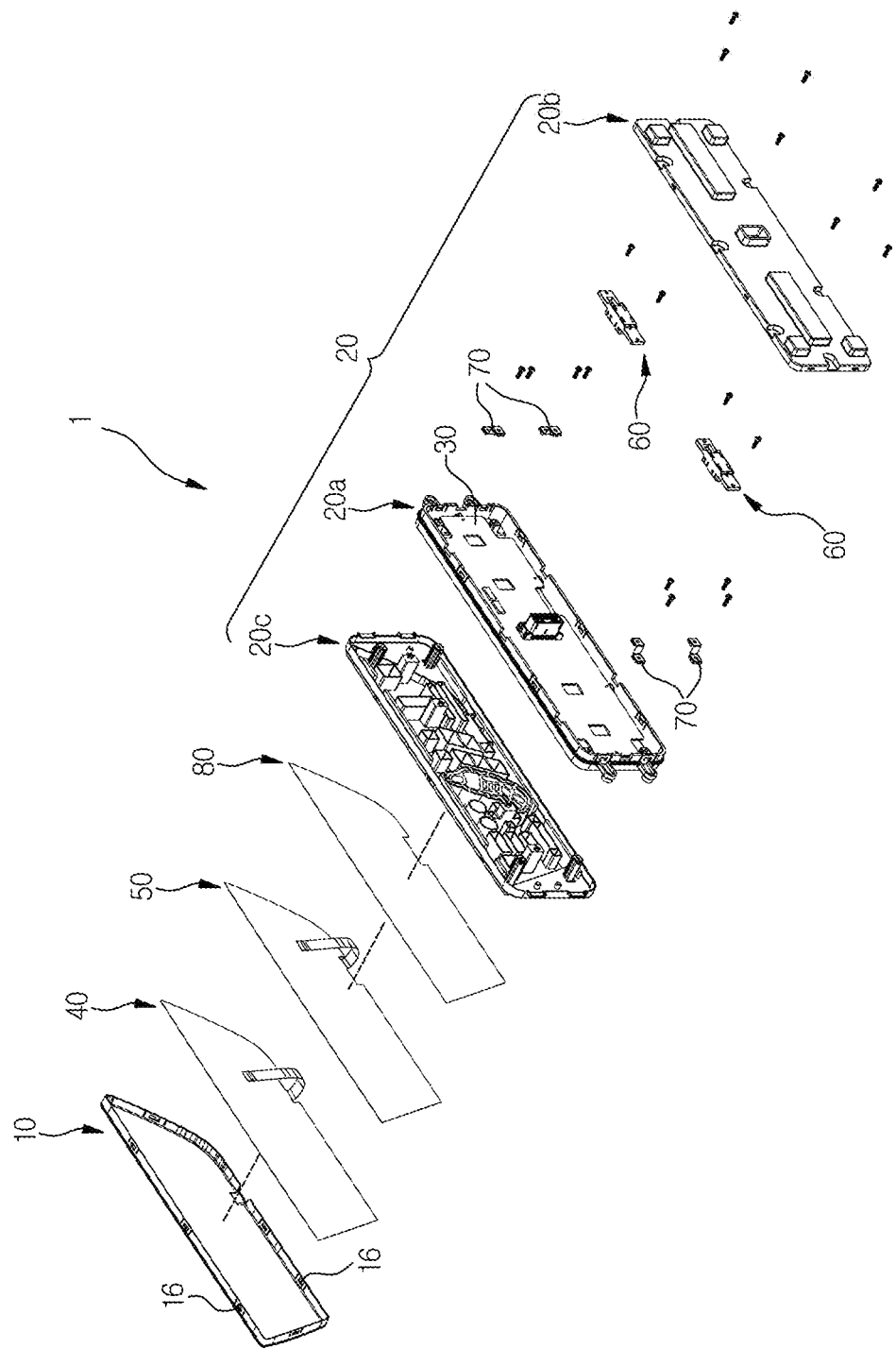
Figure 5:
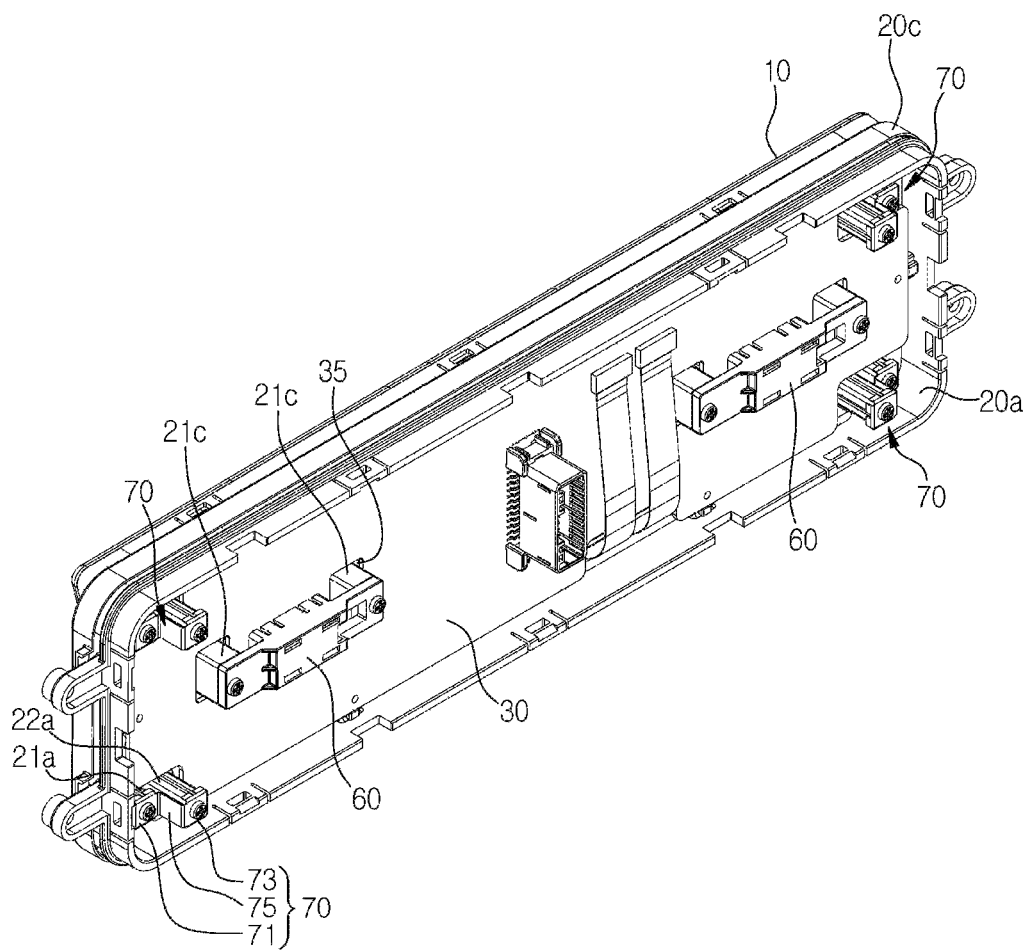
FIG. 5 is a back perspective view in which a cover is removed from FIG. 2.
Figure 6:
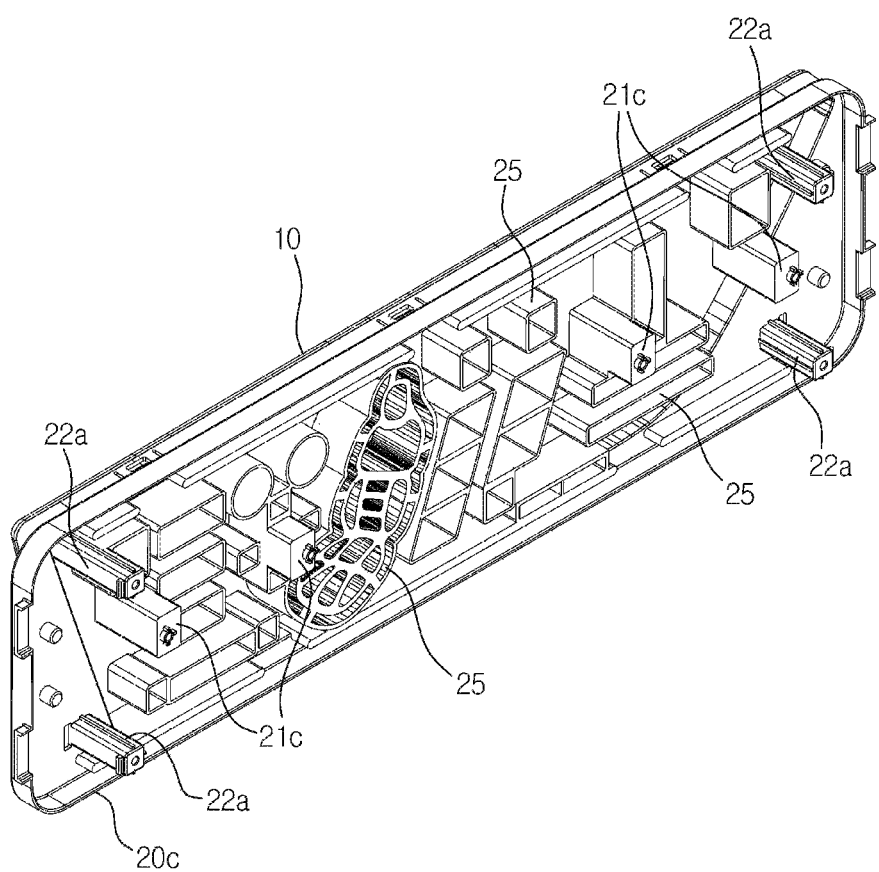
FIG. 6 is a back perspective view in which a case body is removed from FIG. 5.
Figure 7:
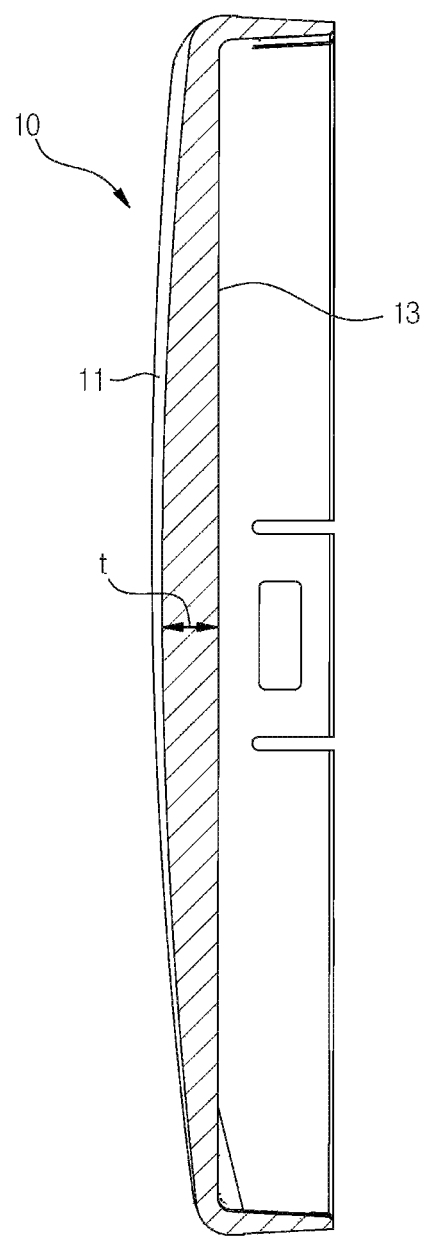
FIG. 7 is a lateral sectional view illustrating an upper case.
Figure 8:
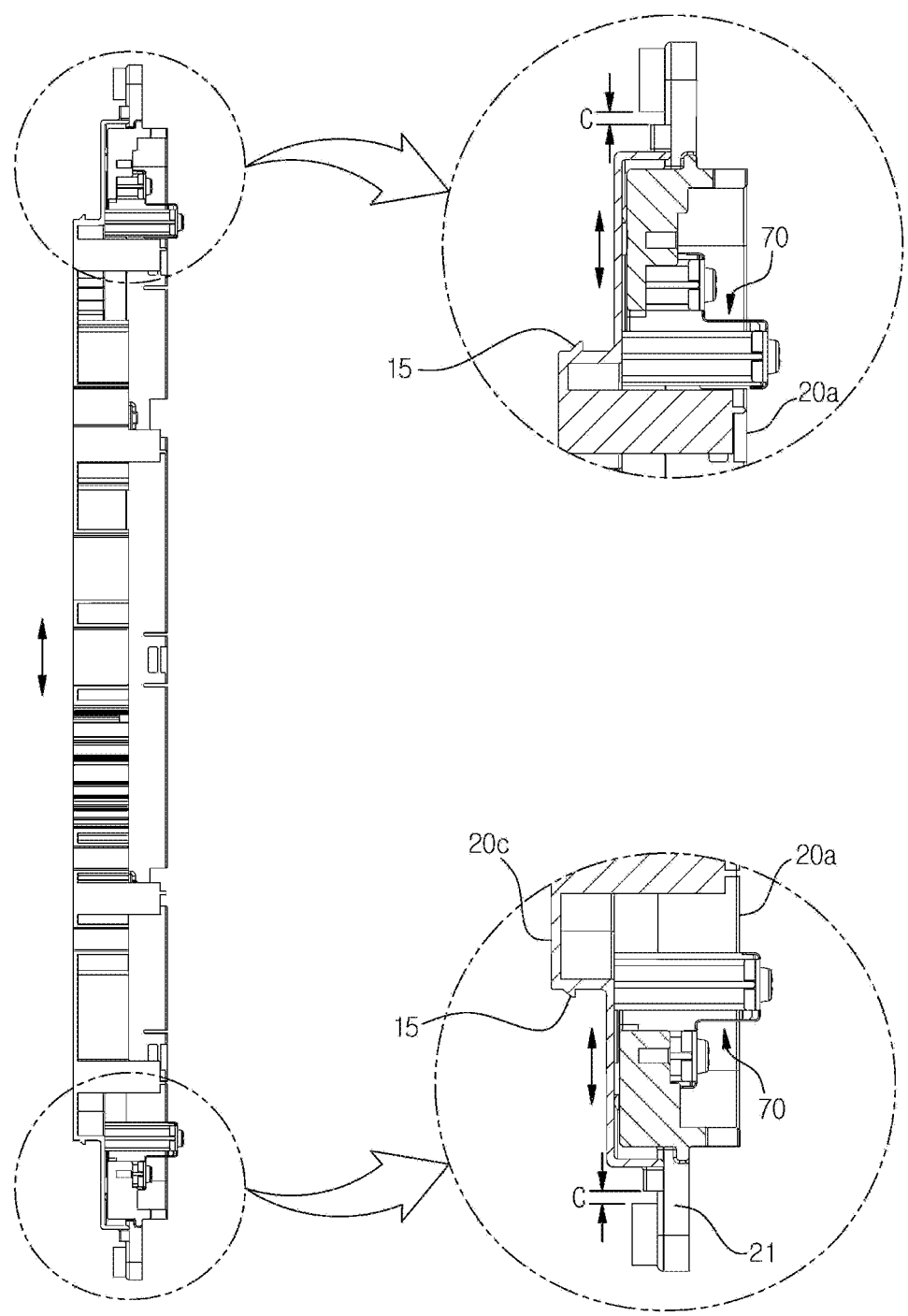
FIG. 8 is a longitudinal sectional view of a case holder and the case body.
Figure 9:
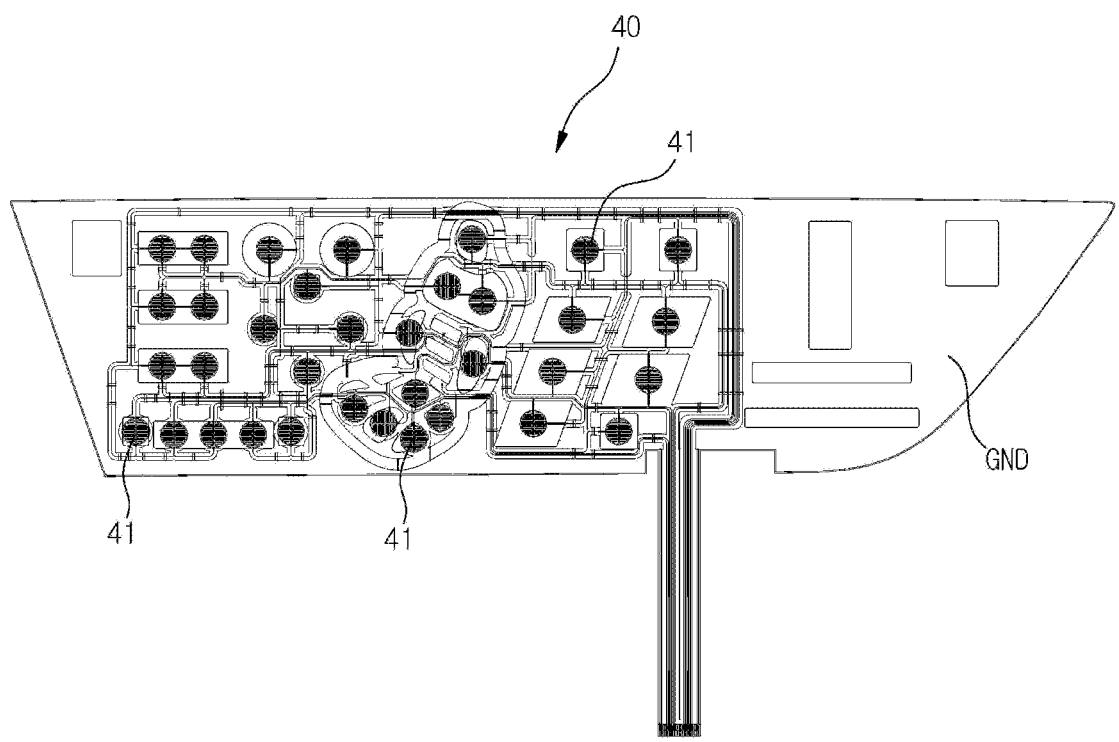
FIGS. 9 and 10 are plan views illustrating a capacitive touch sensor pad and a capacitive force sensor pad.
Figure 10:
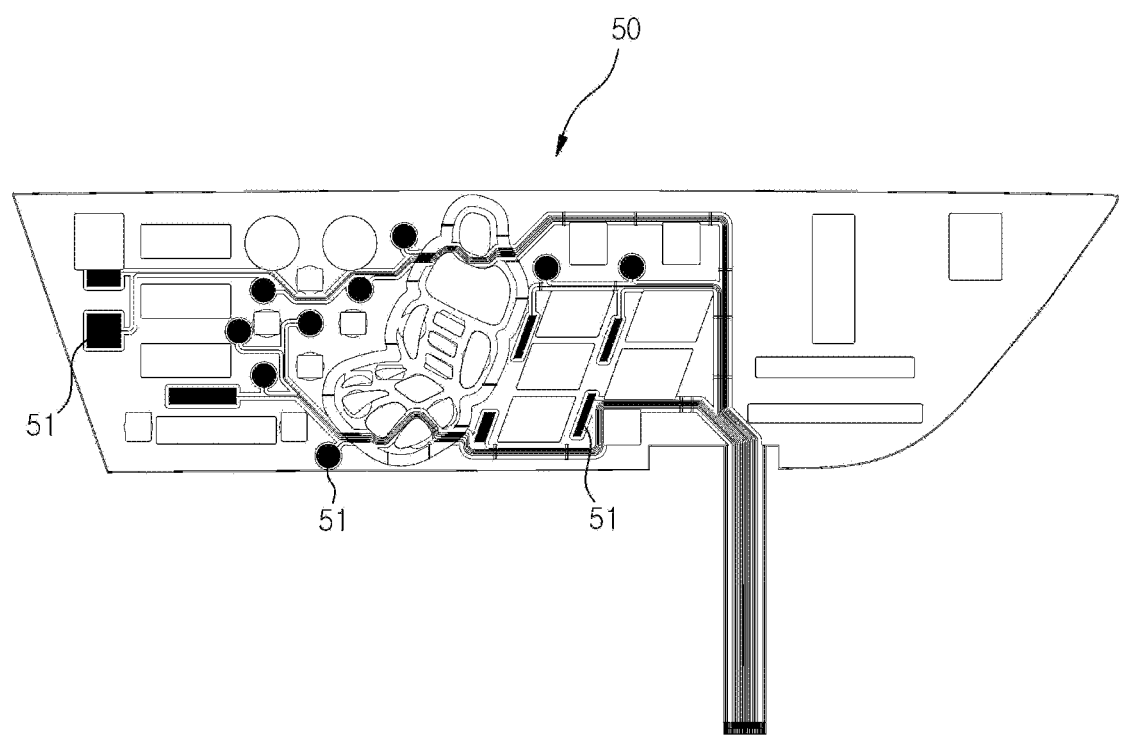
Figure 11:
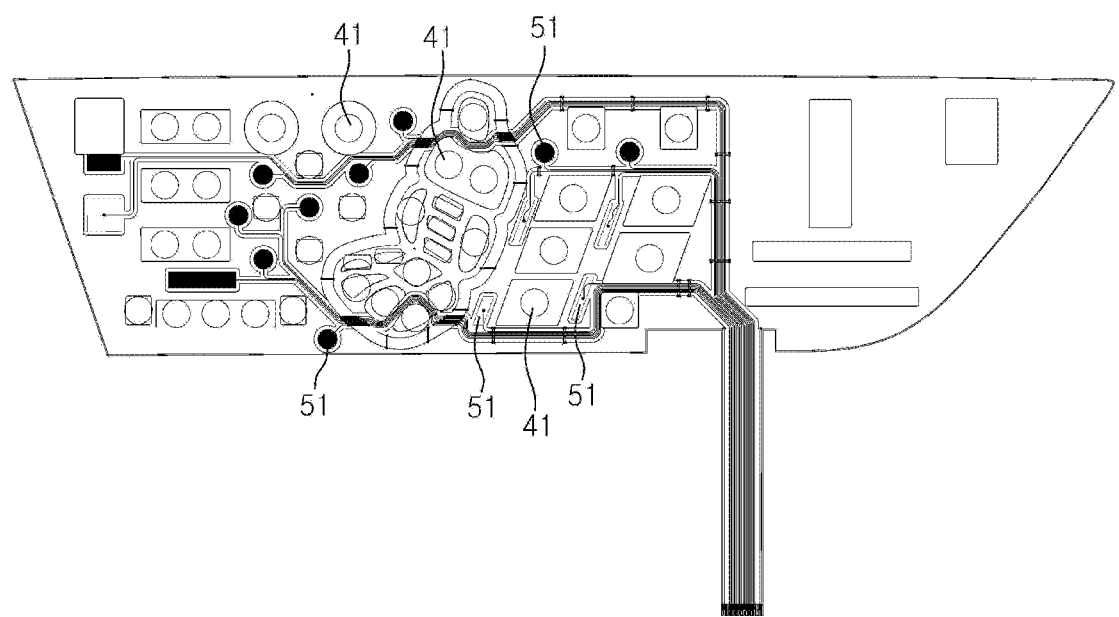
FIG. 11 is a plan view of a state in which FIGS. 9 and 10 overlap each other to face each other.

FIGS. 1 and 2 are front and back perspective views illustrating a smart garnish for an automobile according to an exemplary embodiment of the present invention, and are perspective views in which indirect lighting is turned on in the smart garnish and thus symbols are shown, FIGS. 3 and 4 are exploded perspective views of FIGS. 1 and 2, FIG. 5 is a back perspective view in which a cover is removed from FIG. 2, FIG. 6 is a back perspective view in which a case body is removed from FIG. 5, FIG. 7 is a lateral sectional view illustrating an upper case, FIG. 8 is a longitudinal sectional view of a case holder and the case body, FIGS. 9 and 10 are plan views illustrating a capacitive touch sensor pad and a capacitive force sensor pad, and FIG. 11 is a plan view of a state in which FIGS. 9 and 10 overlap each other to face each other.

Referring to FIGS. 1 to 4, a smart garnish 1 for an automobile according to the embodiment of the present invention includes a case 20, an upper case, 10 in which a film 12 having symbols printed therein is insert-injection-molded, being coupled to the case 20 in front of the case 20, a PCB (printed circuit board) 30 mounted in the case 20, wherein LEDs (light emitting diodes) 31 mounted on the PCB 30 illuminate the symbols, a capacitive touch sensor pad 40 laminated on a rear surface 13 of the upper case 10, and a capacitive force sensor pad 50 laminated on a front surface of the case 20.

Further, when the upper case 10 is assembled on the front of the case 20, a gap (for example, roughly 0.4 to 0.5 mm) is formed between the capacitive touch sensor pad 40 and the capacitive force sensor pad 50

Particularly, as shown in FIG. 9, the capacitive touch sensor pad 40 includes capacitive touch sensors 41 disposed at transparent positions corresponding to the symbols, and a ground (GND) disposed spaced apart from the transparent positions where the capacitive touch sensors 41 are located.

That is, the capacitive touch sensors 41 which are black circles in FIG. 9 (alternatively, solid line circles in FIG. 11) are disposed to correspond at least one-to-one with the symbols of the upper case 10.

As such, the ground (GND) pursues stability, and the capacitive touch sensors 41 pursue sensitivity in a case in which the capacitive touch sensors 41 and the ground (GND) are disposed coplanarly in comparison with a case in which the capacitive touch sensors 41 and the ground (GND) are not disposed coplanarly (double placement where the ground pad is stacked under the capacitive touch sensor pad).

The capacitive force sensor pad 50 includes capacitive force sensors 51 distributed on a portion facing the ground (GND) of the capacitive touch sensor pad 40.

That is, as shown in FIG. 10, it can be seen that the capacitive force sensors 51 are distributed on a background excluding the portions corresponding to the symbols.

As can be seen through FIG. 10, when the portion other than the capacitive touch sensors 41 is pressed, since contact with the ground (GND) occurs, even when the gap is deformed, touch sensing does not occur and thus the capacitive touch sensors 41 do not operate, but when the capacitive touch sensors 51 corresponding to desired symbols are pressed, the surrounding capacitive force sensors 51 operate by sensing a change of the gap while the upper case 10 is pressed.

Even when the capacitive force sensors 51 are sparsely disposed around the positions where the symbols are located, in the case in which a certain symbol of the upper case 10 is pressed, since not only a pressed portion but also a periphery of the pressed portion are bent downward, at least a plurality of capacitive force sensors 51 prevent a malfunction through one-to-many matching which senses a plurality of deformations of the gap.

Generally, as shown in FIG. 11, since a surface 11 of the upper case 10 has a convex or concave three-dimensional (3D) curved surface, a thickness t from the flat rear surface 13 differs by about 2.9 to 5 mm and is also large.

Since the upper case 10 having such a thickness is, for example, bent as a whole when a center thereof is pressed, and is bent with a periphery thereof when an edge thereof is pressed, capacitive force sensing may be stable enough to be performed even when the capacitive force sensors 51 are sparsely and widely distributed.

Like a conventional case, when the capacitive touch sensors 41 and the capacitive force sensors 51 are configured to be matched one-to-one in the upper case 10 formed with the 3D curved surface and the large thickness, in the case in which one desired capacitive touch sensor is brought into contact and pressed, since not only the capacitive force sensor at that location, but also the capacitive force sensors at the periphery are also force-sensed, a malfunction occurs due to a lot of noise.

Accordingly, in the embodiment, even when the force sensors 41 are sparsely disposed corresponding to the ground (GND) rather than the positions corresponding to the symbols, since a touch is accurately sensed and broad force sensing is also accurately sensed, the malfunction may be definitely prevented.

Here, when the capacitive touch sensor pad 40 is attached to the curved surface, since a gap is formed and air fills the gap, a malfunction occurs, and thus the rear surface 13 of the upper case 10 is formed not like the curved surface but like the surface 11 having a flat surface to prevent the malfunction.

As shown in FIGS. 3 and 4, the case 20 includes a case body 20a in which the PCB 30 is mounted, a cover 20b which covers a back surface of the case body 20a, and a case holder 20c disposed on a front surface of the case body 20a and on which the upper case 10 is assembled.

The case body 20a is fastened and fixed to an interior material through a fastening hole bracket 21 formed on a side surface thereof.

The cover 20b is a PCB protection cover, and is fastened and fixed to the case body 20a, and in this case, the PCB 30 is also supported by the case body 20a.

As shown in FIG. 3, in a front surface of the case holder 20c, through-holes 22 are formed corresponding to the symbols of the upper case 10.

Further, the upper case 10 is assembled on a front of the case holder 20c, and fastening protrusions 15 are formed on edges of the case holder 20c and fastening grooves 16 fastened to the fastening protrusions 15 are formed on edges of the upper case 10.

In addition, the case holder 20c is supported on the case body 20a through a haptic actuator 60 to be laterally vibratable.

As shown in FIG. 5, both side plates of the haptic actuator 60 are fastened and fixed to ribs 21c formed on the case holder 20c.

In this case, when the haptic actuator 60 vibrates, since the ribs 21c laterally vibrate and thus the case holder 20c laterally vibrates, long holes 35 which allow the ribs 21c to be inserted therethrough and laterally vibrate are formed in the PCB 30.

The haptic actuator 60 is mounted to laterally vibrate the case holder 20c relative to the case body 20a.

That is, when all the capacitive touch sensors 41 and the capacitive force sensors 51 are sensed, as shown in FIG. 8, since the haptic actuator 60 is operated through the PCB 30, the case holder 20c vibrates by laterally moving within a distance c.

Accordingly, the case holder 20c and the upper case 10 become moving objects which are vibrated, and the case body 20a and the cover 20b become fixed objects which are not vibrated.

In this case, restoring springs 70 which elastically restore the case holder 20c to an original position relative to the case body 20a may be further included.

As shown in FIG. 5, the restoring springs 70 are implemented as plate springs 70, wherein one end of each of the plate springs 70 is coupled to the case body 20a and another end of each of the plate springs 70 is coupled to the case holder 20c.

The plate springs 70 are bent plates mounted in the case 20, and may include front horizontal plate springs 71 installed at ribs 21a of the case body 20a, back horizontal plate springs 73 installed at ribs 22a of the case holder 20c, and vertical plate springs 75 which connect the front and back horizontal plate springs 71 and 73. The vertical plate springs 75 may connect may connect, for example, lateral ends of the front and back horizontal plate springs 71 and 73

The vertical plate springs 75 substantially serve as the restoring springs.

As shown in FIG. 8, the case holder 20c is disposed to be capable of laterally moving by the distance c through vibration relative to the case body 20a.

Meanwhile, as shown in FIG. 3, the through-holes 22 through which a light from the LEDs 31 passes are formed on the front surface of the case holder 20c.

Further, as shown in FIG. 6, in the case holder 20c, light guide tubes 25 which guides the light through the through-holes 22 for the LEDs 31 are formed.

The light guide tubes 25 are tubes which extend rearward from the through-holes 22, and also serve to prevent light leakage.

Further, as shown in FIGS. 3 and 4, a diffusion sheet 80 may be further included between the capacitive force sensor pad 50 and the case holder 20c.

The diffusion sheet 80 simultaneously contributes to secondary shielding and uniformity of illuminance.

Hereinafter, an operation according to the embodiment will be described.

First, when a driver pushes the capacitive touch sensor 41 corresponding to a desired symbol among the symbols of the upper case 10 by a finger, a first capacitance is formed between the finger which is a conductor and the capacitive touch sensor 41, and a second capacitance is formed due to a gap change between a pressed and drooping portion of the upper case 10 and the capacitive force sensor pad 50.

Accordingly, when both the first and second capacitances are input to the PCB 30, a mode of the touched symbol is operated, and in addition, feedback is provided due to vibration of the haptic actuator 60.

Since the embodiments according to the concept of the present disclosure may be variously changed and have various forms, the embodiments will be exemplified and described in the drawings, but the embodiments according to the concept of the present disclosure are not limited to the particular embodiments and include all changes, equivalents, and substitutes within the spirit and the scope of the present disclosure.

The invention claimed is:

1. A smart garnish for an automobile comprising:
   a case;
   an upper case, in which a film having symbols printed therein is insert-injection-molded, being coupled to the case in front of the case;
   a capacitive touch sensor pad laminated on a rear surface of the upper case;
   a capacitive force sensor pad laminated on a front surface of the case; and
   a PCB (printed circuit board) mounted in the case, wherein LEDs (light emitting diodes) mounted on the PCB illuminate the symbols,
   wherein a gap is formed between the capacitive touch sensor pad and the capacitive force sensor pad,
   wherein the capacitive touch sensor pad includes capacitive touch sensors disposed corresponding to the symbols, and a ground (GND) disposed spaced apart from the capacitive touch sensor, and
   wherein the capacitive force sensor pad includes capacitive force sensors distributed corresponding to the ground (GND),
   wherein the case includes:
      a case body in which the PCB is mounted;
      a cover configured to cover a back surface of the case body; and
      a case holder disposed on a front surface of the case body, wherein the upper case is assembled on the case holder, and
   wherein a haptic actuator configured to vibrate the case holder relative to the case body is mounted in the case,
   wherein both side plates of the haptic actuator are fastened and fixed to ribs formed on the case holder,
   wherein long holes which allow the ribs to be inserted therethrough and laterally vibrate fife formed in the PCB, and
   wherein the case holder and the upper case become moving objects which are vibrated, and the case body and the cover become fixed objects which are not vibrated.

2. The smart garnish for an automobile of claim 1, wherein:
   a surface and the rear surface of the upper case are formed of a three-dimensional (3D) curved surface and a flat surface;
   the film is installed on the surface of the upper case; and
   the capacitive touch sensor pad is installed on the flat surface of the upper case.

3. The smart garnish for an automobile of claim 1, further comprising a restoring spring configured to elastically restore the case holder relative to the case body.

4. The smart garnish for an automobile of claim 3, wherein the restoring spring is a plate spring,
   wherein an end of the plate spring is coupled to the case body and another end of the plate spring is coupled to the case holder, and
   wherein the plate spring includes:
      a front horizontal plate spring installed at the case body;
      a back horizontal plate spring installed at the case holder; and
      a vertical plate spring configured to connect the front and back horizontal plate springs.

5. The smart garnish for an automobile of claim 4, further comprising a diffusion sheet disposed between the capacitive force sensor pad and the case holder.

6. The smart garnish for an automobile of claim 5, wherein:
   through-holes through which a light from the LEDs passes are formed on a front surface of the case holder; and light guide tubes configured to connect the LEDs and the through-holes are formed in the case holder.

* * * * *